(12) United States Patent
McKenzie et al.

(10) Patent No.: US 7,932,018 B2
(45) Date of Patent: Apr. 26, 2011

(54) ANTIREFLECTIVE COATING COMPOSITION

(75) Inventors: Douglas McKenzie, Easton, PA (US);
David Abdallah, Bernardsville, NJ (US);
Allen G. Timko, Flemington, NJ (US);
M. Dalil Rahman, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 100 days.

(21) Appl. No.: 12/115,776

(22) Filed: May 6, 2008

(65) Prior Publication Data

US 2009/0280435 A1 Nov. 12, 2009

(51) Int. Cl.
G03F 7/09 (2006.01)
G03F 7/075 (2006.01)

(52) U.S. Cl. .................. 430/325; 430/311; 430/271.1

(58) Field of Classification Search .................. None
See application file for complete search history.

(56) References Cited

U.S. PATENT DOCUMENTS

| | | | |
|---|---|---|---|
| 3,474,054 A | 10/1969 | White | |
| 3,474,058 A | 10/1969 | Ridgeway et al. | |
| 4,200,729 A | 4/1980 | Calbo | |
| 4,251,665 A | 2/1981 | Calbo | |
| 4,463,162 A | 7/1984 | Nogami et al. | |
| 4,491,628 A | 1/1985 | Ito et al. | |
| 4,719,166 A | 1/1988 | Blevins et al. | |
| 5,187,019 A | 2/1993 | Calbo et al. | |
| 5,294,680 A * | 3/1994 | Knors et al. | 525/327.4 |
| 5,350,660 A | 9/1994 | Urano et al. | |
| 5,607,824 A | 3/1997 | Fahey et al. | |
| 5,688,598 A | 11/1997 | Keck et al. | |
| 5,747,599 A | 5/1998 | Ohnishi | |
| 5,843,624 A | 12/1998 | Houlihan et al. | |
| 5,935,760 A * | 8/1999 | Shao et al. | 430/271.1 |
| 5,965,679 A | 10/1999 | Godschalx et al. | |
| 5,981,145 A * | 11/1999 | Ding et al. | 430/271.1 |
| 6,048,956 A | 4/2000 | Muto et al. | |
| 6,121,495 A | 9/2000 | Babb et al. | |
| 6,165,684 A | 12/2000 | Mizutani et al. | |
| 6,255,394 B1 | 7/2001 | Onizawa | |
| 6,268,072 B1 | 7/2001 | Zheng et al. | |
| 6,316,165 B1 * | 11/2001 | Pavelchek et al. | 430/311 |
| 6,410,208 B1 | 6/2002 | Teng | |
| 6,447,780 B1 | 9/2002 | Srivastava et al. | |
| 6,723,488 B2 | 4/2004 | Kudo et al. | |
| 6,737,492 B2 | 5/2004 | Kang et al. | |
| 6,783,916 B2 * | 8/2004 | Foster et al. | 430/270.1 |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,899,963 B1 | 5/2005 | Zheng et al. | |
| 6,916,590 B2 | 7/2005 | Kaneko et al. | |

(Continued)

FOREIGN PATENT DOCUMENTS

EP 0 845 486 A1 6/1998

(Continued)

OTHER PUBLICATIONS

Nishimura at al., Comparison of single-, bi-, and tri-layer resist process, SPIE vol. 5753, pp. 611-pp. 618, 2005. Complete set of specification papers for U.S. Appl. No. 12/060,307, filed Apr. 1, 2008 with cover page.
Complete set of specification papers for U.S. Appl. No. 12/270,189, filed Nov. 13, 2008 with cover page.
Complete set of specification papers for U.S. Appl. No. 12/270,256, filed Nov. 13, 2008 with cover page.
Complete set of specification papers for U.S. Appl. No. 12/332,501, filed Dec. 11, 2008 with cover page.

(Continued)

*Primary Examiner* — Cynthia Hamilton
(74) *Attorney, Agent, or Firm* — Sangya Jain

(57) ABSTRACT

The invention relates to an antireflective coating composition comprising a polymer, a crosslinker and a thermal acid generator, where the polymer comprises at least one unit of structure (1), at least one unit of structure (2) and at least one structure of structure (3),

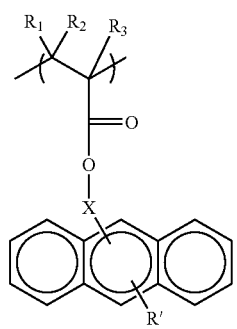

(1)

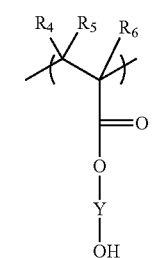

(2)

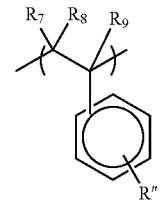

(3)

where $R_1$ to $R_9$ is independently selected from H and $C_1$-$C_6$ alkyl, R' and R" is independently selected from H and $C_1$-$C_6$ alkyl, X is $C_1$-$C_6$ alkylene, Y is $C_1$-$C_6$ alkylene. The invention further relates to a process for imaging a photoresist coated over the antireflective coating composition.

18 Claims, 1 Drawing Sheet

U.S. PATENT DOCUMENTS

| | | |
|---|---|---|
| 7,132,216 B2 | 11/2006 | Shao et al. |
| 7,214,743 B2 | 5/2007 | Hatakeyama et al. |
| 7,303,855 B2 | 12/2007 | Hatakeyama et al. |
| 2001/0006759 A1 | 7/2001 | Shipley et al. |
| 2002/0094382 A1 | 7/2002 | Imai et al. |
| 2003/0180559 A1 | 9/2003 | Wayton et al. |
| 2004/0219453 A1 | 11/2004 | Pavelchek et al. |
| 2005/0007016 A1 | 1/2005 | Mori et al. |
| 2005/0058929 A1 | 3/2005 | Kennedy et al. |
| 2005/0095434 A1 | 5/2005 | Hirota et al. |
| 2005/0186444 A1 | 8/2005 | Zheng et al. |
| 2005/0282091 A1 | 12/2005 | Hatakeyama |
| 2006/0177774 A1 | 8/2006 | Abdallah et al. |
| 2006/0204891 A1 | 9/2006 | Hatakeyama |
| 2006/0222999 A1 | 10/2006 | Miyazaki et al. |
| 2006/0234158 A1 | 10/2006 | Hatakeyama |
| 2006/0275696 A1 | 12/2006 | Zampini et al. |
| 2007/0057253 A1 | 3/2007 | Grunbeck et al. |
| 2008/0160461 A1 | 7/2008 | Yoon et al. |
| 2008/0292987 A1 | 11/2008 | Houlihan et al. |
| 2008/0292995 A1 | 11/2008 | Houlihan et al. |
| 2008/0305441 A1 | 12/2008 | Yoon et al. |
| 2009/0176165 A1 | 7/2009 | Cheon et al. |
| 2009/0246691 A1 | 10/2009 | Rahman et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |

FOREIGN PATENT DOCUMENTS

| | | |
|---|---|---|
| EP | 0 933 681 A1 | 8/1999 |
| EP | 1 085 529 A2 | 3/2001 |
| EP | 1 088 875 A2 | 4/2001 |
| EP | 1 829 942 A1 | 9/2007 |
| EP | 1 845 416 A2 | 10/2007 |
| EP | 1 705 519 A2 | 9/2009 |
| JP | 62-230843 A | 10/1987 |
| JP | 63-51419 A | 3/1988 |
| JP | 10-273635 A | 10/1998 |
| JP | 11-249311 A | 9/1999 |
| JP | 2002-14474 A | 1/2002 |
| JP | 2003-82070 A | 3/2003 |
| JP | 2005-43471 A | 2/2005 |
| WO | WO 2008/082241 A1 | 7/2008 |
| WO | WO 2008/120855 A1 | 10/2008 |
| WO | WO-2008/142546 A2 * | 11/2008 |

OTHER PUBLICATIONS

Office Action dated Mar. 6, 2009 from U.S. Appl. No. 11/752,040.
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/001284.
English Language Abstract from EPO of JP 62-230843 A.
English Language Abstract from JPO of JP 63-51419 A.
English Language Abstract of XP002503793 retrieved from STN Database accession No. 1999:587958, Database CA [Online] Chemical Abstracts Services, Columbus, Ohio, USA, (Sep. 20, 1999).
English Language Abstract of XP0025003794 retrieved from STN Database Accession No. 1988: 205733, Database CA [Online] Chemical Abstracts Services, Columbus, Ohio, USA, (Jun. 11, 1998).
English Language Abstract of XP002503795 retrieved from Database WPI Week accession No. 1999-57548 [49], Thomson Scientific, London, GB.
English Language Abstract of XP002504600 retrieved from STN Database Accession No. 2002:47842, Database CA [Online] Chemical Abstracts Services, Columbus, Ohio, USA, (Jan. 18, 2002).
H. Harada et al., "Progress of Hard Mask Material for Multi-layer stack application", SPIE vol. 6519, pp. 65190N-1-pp. 65190N-9 (2007).
Nishimura et al., Comparison of single-, bi-, and tri-layer resist process, SPIE vol. 5753, pp. 611-pp. 618 (2005).
Harada et al., "Progress of Hard Mask Material for Multi-layer stack application", SPIE vol. 6519, pp. 65190N-1-pp. 65190N-9 (2007).
U.S. Appl. No. 11/752,040, filed May 22, 2007, Houlihan et al.
U.S. Appl. No. 11/872,962, filed Oct. 16, 2007, Houlihan et al.
U.S. Appl. No. 12/270,189, filed Nov. 13, 2008, Rahman et al.
U.S. Appl. No. 12/270,256, filed Nov. 13, 2008, Rahman et al.
U.S. Appl. No. 12/332,501, filed Dec. 11, 2008, Rahman et al.
U.S. Appl. No. 12/482,189, filed Jun. 10, 2009, Rahman et al.
U.S. Appl. No. 12/646,191, filed Dec. 23, 2009, Rahman et al.
Office Action mail date Mar. 6, 2010 for U.S. Appl. No. 11/752,040.
Office Action mail date Dec. 16, 2009 for U.S. Appl. No. 11/872,962.
Office Action mail date Dec. 7, 2009 for U.S. Appl. No. 12/060,307.
Form PCT/IB/326, Form PCT/IB/373, and Form PCT/ISA/237 for PCT/IB2008/001284 dated Dec. 3, 2009, which corresponds to U.S. Appl. No. 11/872,962.
Form PCT/ISA/220, Form PCT/ISA/210, and Form PCT/ISA/237 for PCT/IB2009/005147 dated Jul. 22, 2009, which corresponds to U.S. Appl. No. 12/115,776.
Form PCT/ISA/220, Form PCT/ISA/210, and Form PCT/ISA/237 for PCT/IB2009/005186 dated Jul. 14, 2009, which corresponds to U.S. Appl. No. 12/270,189.
Form PCT/ISA/220, Form PCT/ISA/210, and Form PCT/ISA/237 for PCT/IB2009/005185 dated Jul. 14, 2009, which corresponds to U.S. Appl. No. 12/270,256.
Derwent Abstract of JP 10-273636 A generated May 17, 2010.
Office Action mail date Jul. 28, 2010 for U.S. Appl. No. 11/872,962.
Office Action mail date May 26, 2010 for U.S. Appl. No. 12/060,307.
Office Action mail date Aug. 5, 2010 for U.S. Appl. No. 12/270,189.
Guo, et al., "Nanoimprint Lithography: Methods and Material Requirements**", Advanced Materials, vol. 19, pp. 495-pp. 513, 2007.
387673, epoxy/hydroxyl functaionalized average MW-2.600, average mn-1,300, from http://www.sigmaaldrich.com/catalog/ProductDetail.do?lang=en&N4=387671ALDRICH& N5=SEARCH_. . . , printed our May 24, 2010, 2 pages From SIGMA-ALDRICH catalog online.
Communication pursuant to Article 94(3) EPC (EPO Form 2001) for EP 08 751 011.1 dated Aug. 11, 2010, which corresponds to U.S. Appl. No. 11/872,962.
Notice of Allowance and Fee(s) Due dated Oct. 1, 2010 for U.S. Appl. No. 12/060,307.
Office Action mail date Oct. 8, 2010 for U.S. Appl. No. 12/270,256.
Form PCT/ISA/220, Form PCT/ISA/210, and Form PCT/ISA/237 for PCT/IB2010/001401 dated Sep. 23, 2010, which corresponds to U.S. Appl. No. 12/482,189.
Advisory Action mail dated Oct. 15, 2010 for U.S. Appl. No. 11/872,962.
Advisory Action mail dated Nov. 18, 2010 for U.S. Appl. No. 11/872,962.
Form PCT/IB/326, Form PCT/IB/373, and Form PCT/ISA/237 for PCT/IB2009/005147 dated Nov. 18, 2010, which corresponds to U.S. Appl. No. 12/115,776.
Office Action dated Nov. 9, 2010 for U.S. Appl. No. 12/332,501.

* cited by examiner

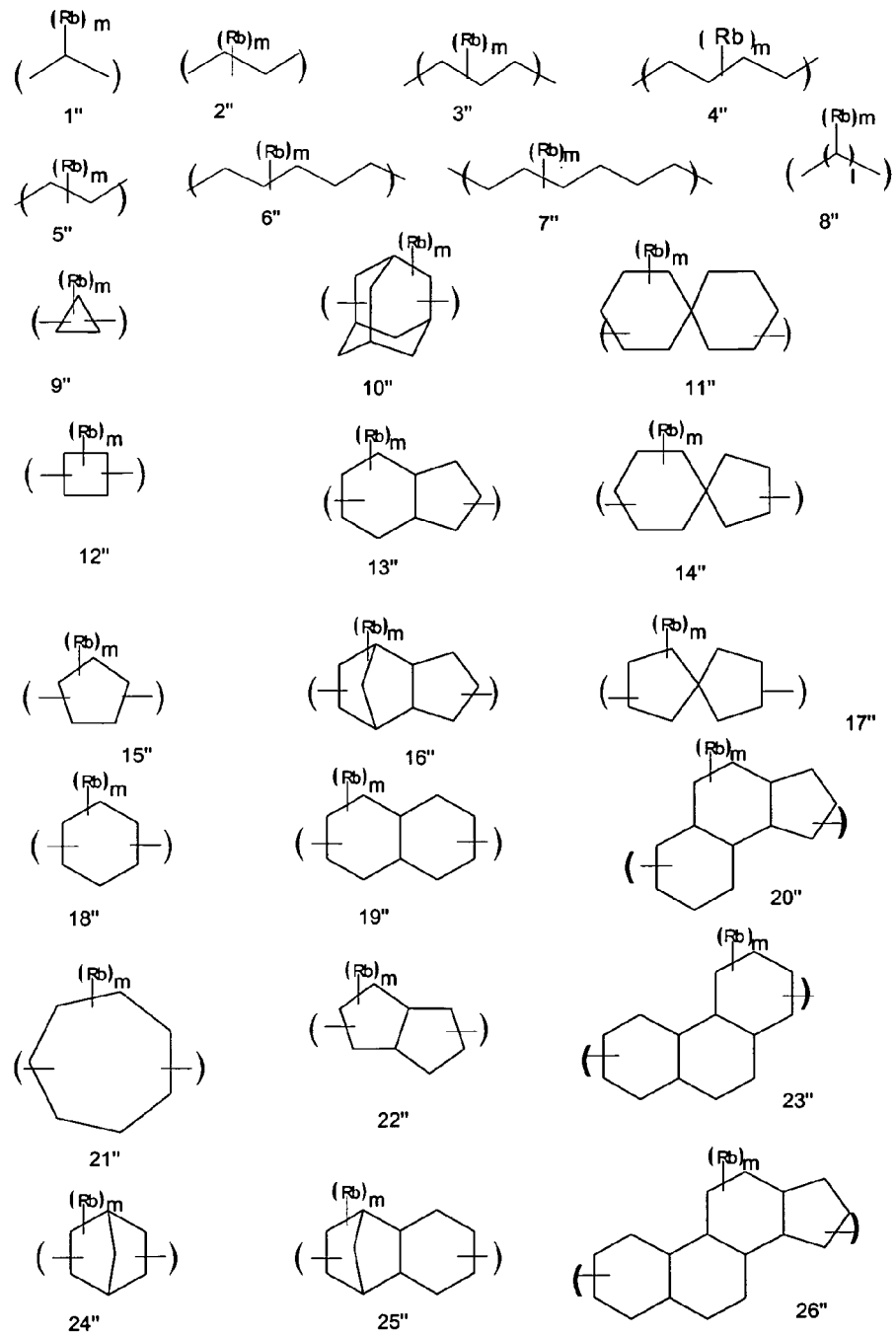
Figure 1: Examples of the aliphatic moiety.

ANTIREFLECTIVE COATING COMPOSITION

FIELD OF INVENTION

The present invention relates to an absorbing antireflective coating composition comprising a polymer, a crosslinker and a thermal acid generator, and a process for forming an image using the antireflective coating composition. The process is especially useful for imaging photoresists using radiation in the deep and extreme ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to decreasing wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates and to provide better masking properties during dry etching. An antireflective coating coated beneath a photoresist and above a reflective substrate provides significant improvement in lithographic performance of the photoresist. Typically, the bottom antireflective coating(s)/underlayer(s) are applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing a organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist. The coating may also be used for filling vias, and further imaging. Thus there is a need for better antireflective layers and underlayers which provide superior lithographic properties particularly etch resistance for hard mask applications and absorption to prevent reflections of radiation into the photoresist.

SUMMARY OF THE INVENTION

The invention relates to an antireflective coating composition comprising a polymer, a crosslinker and a thermal acid generator, where the polymer comprises at least one unit of structure (1), at least one unit of structure (2) and at least one structure of structure (3),

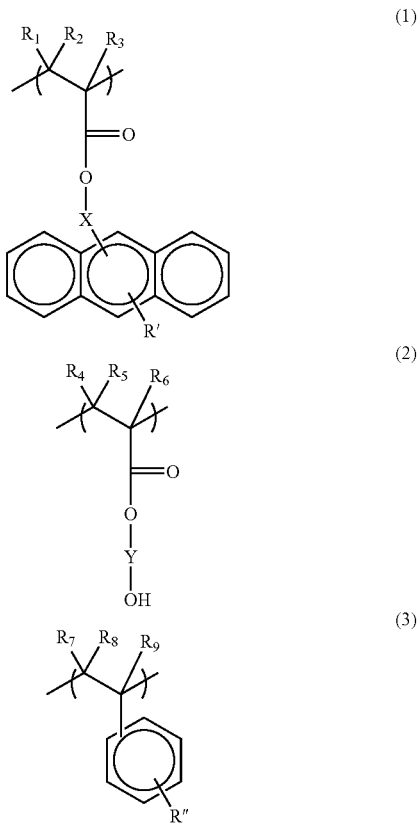

where $R_1$ to $R_9$ is independently selected from H and $C_1$-$C_6$ alkyl, R' and R" is independently selected from H and $C_1$-$C_6$ alkyl, X is $C_1$-$C_6$ alkylene, Y is $C_1$-$C_6$ alkylene. The invention further relates to a process for imaging a photoresist coated over the antireflective coating composition.

BRIEF DESCRIPTION OF DRAWING

FIG. 1 shows examples of the aliphatic moiety.

DESCRIPTION OF THE INVENTION

The present invention relates to a novel organic spin coatable antireflective coating composition. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

The novel composition of the present invention comprises a novel polymer, a crosslinker and a thermal acid generator, where the polymer comprises at least one unit of structure (1), at least one unit of structure (2) and at least one unit of structure (3),

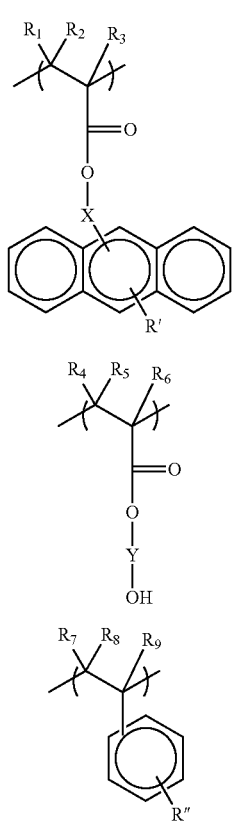

where $R_1$, to $R_9$ is independently selected from H and $C_1$-$C_6$ alkyl, R' and R" is independently selected from H and $C_1$-$C_6$ alkyl, X is $C_1$-$C_6$ alkylene, Y is $C_1$-$C_6$ alkylene. The unit of structure (2) can be present in the polymer at a concentration of about 20 mole % to about 35 mole %, or about 22 mole % to about 35 mole %, or about 22 mole % to about 30 mole %, or about 22 mole % to about 27 mole % in the polymer. In one embodiment of the polymer, $R_1$, to $R_9$ is independently selected from H and $C_1$-$C_6$ alkyl, R' and R" is independently selected from H and $C_1$-$C_6$ alkyl and optionally may not comprise a hydroxy group, X is $C_1$-$C_6$ alkylene, Y is $C_1$-$C_6$ alkylene, and further where the unit of structure (2) is present in the polymer at a concentration of about 20 mole % to about 35 mole %, or about 22 mole % to about 35 mole %, or about 22 mole % to about 30 mole %, or about 22 mole % to about 27 mole % in the polymer. In the polymer, the unit of structure 1 may range from about 20 mole % to about 60 mole %, or range from about 30 mole % to about 50 mole %, or range from about 30 mole % to about 45 mole %. In the polymer, the unit of structure 3 may range from about 20 mole % to about 60 mole %, or range from about 30 mole % to about 50 mole %, or range from about 30 mole % to about 45 mole %. In one embodiment the novel polymer may comprise the structure from unit 1 in the range from about 30 mole % to about 45 mole %, the structure from unit 3 in the range from about 30 mole % to about 45 mole %, and the structure from unit 2 in the range from about 20 mole % to about 35 mole %, or about 20 mole % to about 35 mole %, or about 22 mole % to about 35 mole %, or about 22 mole % to about 30 mole %, or about 22 mole % to about 27 mole %. The ratio of unit of structure 1 and structure 3 may be about 1:1. In one embodiment of the novel polymer the ratio of unit of structure 1:unit of structure 3:unit with structure 2 is about 1:1:0.65±0.1 mole or 1:1:0.65±0.05 mole. The novel composition is useful for where the carbon content of the composition is in the range of about 75 weight % to about 95 weight %, or about 80 weight % to about 90 weight %. The novel composition may further comprise a solvent comprising propyleneglycol-monomethyl ether (PGME). The invention also relates to a process for imaging a photoresist layer coated above the novel antireflective coating layer. The novel coating is especially useful for 193 nm irradiation.

The polymer of the novel composition comprises at least one unit of structure (1), at least one unit of structure (2) and at least one structure of structure (3), where the structures comprising the polymer are described above. The units of structure 1 and 3 provide the polymer with high carbon content and absorption, and the unit of structure 2 provides the polymer with solubility in a polar organic coating solvent. Thus the concentration of unit of structure 2 is optimized to give a polymer with both the appropriate solubility and also as high carbon content as possible, such that a spin coating can be formed. The monomeric unit of structure 1 may be derived from a (meth)acrylate with a pendant alkyleneanthracene group. One preferred unit is where X is methylene in structure 1. The monomeric unit of structure 2 may be derived from a (meth)acrylate with a pendant alkanol group. One preferred unit is where Y is selected from methylene, ethylene, propylene, butylene in structure 2. One embodiment of structure 2 is where Y is ethylene. The monomeric unit of structure 3 may be derived from styrene or alkylated styrene. One preferred unit for structure 1 is styrene. The term (meth)acrylate herein refers to methacrylate or acrylate. Alkyl described herein may be linear or branched aliphatic moiety.

One embodiment of the polymer is comprising units of structures 4, 5 and 6,

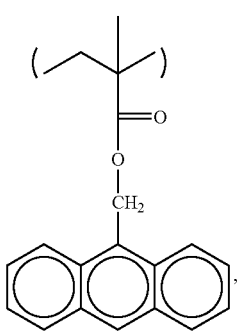

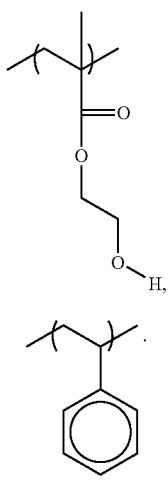

In the polymer, the unit of structure (2) may be present at about 20 mole % to about 35 mole %, or about 22 mole % to about 35 mole %, or about 22 mole % to about 30 mole %, or about 22 mole % to about 27 mole % in the polymer. The unit of structure 1 may range from about 20 mole % to about 60 mole %, or range from about 30 mole % to about 50 mole %, or range from about 30 mole % to about 45 mole %. In the polymer, the unit of structure 3 may range from about 20 mole % to about 60 mole %, or range from about 30 mole % to about 50 mole %, or range from about 30 mole % to about 45 mole %. In one embodiment the novel polymer may comprise the structure from unit 4 in the range from about 30 mole % to about 45 mole %, the structure from unit 6 in the range from about 30 mole % to about 45 mole %, and the structure from unit 5 in the range from about 20 mole % to about 35 mole %, or about 20 mole % to about 35 mole %, or about 22 mole % to about 35 mole %, or about 22 mole % to about 30 mole %, or about 22 mole % to about 27 mole %. The ratio of unit of structure 4 and structure 6 may be about 1:1.

The polymer of the present invention may be synthesized using techniques useful for free radical polymerization or ionic polymerization. The polymer comprises the unit from structure (1) at a concentration in the range from about 20 mole % to about 60 mole %; the unit from structure (3) at a concentration in the range from 20 mole % to about 60 mole %; and the unit from structure (2) at a concentration in the range from 20 to 35 mole %. The ratio of the 3 units is optimized to give the required solubility in the appropriate coating solvent composition, the required carbon content and also appropriate absorption at the wavelength of exposure used to expose the photoresist coated above the novel coating. In one embodiment the coating solvent comprises PGME and the exposure wavelength is 193 nm. In the present invention, polymerization may be conducted in a proper solvent using a free radical or ionic reaction initiator. The resulting copolymer may be of various structures such as a random copolymer or a block copolymer. Solvents for the polymerization are illustrated by toluene, tetrahydrofuran, benzene, dimethylformamide, dimethylsulfoxide, ethyl lactate, propylene glycol monomethyl-ether acetate (PGMEA), propylene glycol monomethyl-ether, cyclopentanone, cyclohexanone, butyrolactone, 2-heptanone, ethyl-3-ethoxypropanate, ethylene glycol monoethyl acetate, methyl-3-methoxypropanate, etc. These solvents may be used alone or in combination of two or more of them. Specific examples of the reaction initiators are illustrated 2,2'-azobis(isobutyronitrile)(AIBN), 2,2'-azobis (4-methoxy-2,4-dimethylvaleronitrile), 2,2'-azobis(2-cyclopropylpropionitrile), 2,2'-azobis(2,4-dimethyl valeronitrile), 2,2'-azobis(2,4-dimethylpentanenitrile), 1,1'-azobis(cyclohexanecarbonitrile), benzoyl peroxide, t-butyl peroxy benzoate, di-t-butyl diperoxy phthalate, t-butyl peroxy-2-ethyl hexanoate, t-butyl peroxy pivalate, t-amyl peroxy pivalate, butyl lithium, etc. However, initiators are not limited only to these. The polymer may be separated from the solvent, then again dissolved in a proper solvent to prepare an anti-reflective coating composition or, if the solvent is used in the synthesis reaction, this can be utilized as a solvent for the anti-reflection coating composition. Additionally, the anti-reflective coating composition is subjected to filtration using, for example, a 0.5, 0.2 or 0.1 micron filter to remove insoluble fine particles. The filtered solution may directly be applied to a substrate such as a wafer.

The molecular weight of the polymer varies depending upon polymerization time, reaction temperature, concentrations of used monomers and initiators, kind of reaction medium, etc. and can easily be controlled by properly selecting these parameters. Typically the weight average molecular weight of the polymer may range from about 1,500 to about 50,000 as measured by a Gel Permeation Chromatograph.

The novel composition of the present invention comprises the polymer and further comprises a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the polymer. Examples of compounds which can be crosslinkers are, 1,3 adamantane diol, 1,3,5 adamantane triol, polyfunctional reactive benzylic compounds, methylols like tetramethoxymethyl-bisphenol (TMOM-BP) of structure (7), aminoplast crosslinkers, glycolurils, Cymels, Powderlinks, etc. Polymeric crosslinkers, such as polymers of glycoluril and polyols, may also be used.

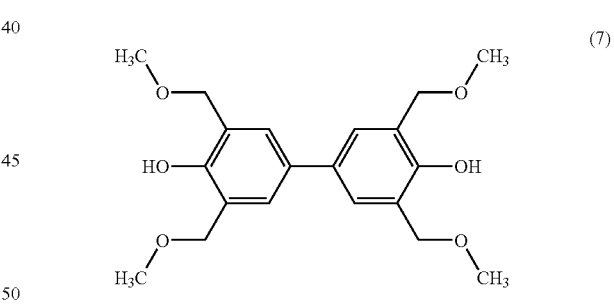

The novel composition comprising the polymer also comprises an acid generator and the crosslinker. The crosslinker is described previously. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA. An example is dodecylbenzene sulfonic acid/triethylamine salt.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydroxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The inventive embodiments of the composition described herein may further comprise a second absorbing polymer. The second polymer may be present at least at a level greater than 10 weight % of the total polymer composition. The second polymer may be present in the range of about 60 weight % to about 10 weight % of the total polymer composition, or in the range of about 60 weight % to about 20 weight %, or in the range of about 60 weight % to about 30 weight %, or in the range of about 60 weight % to about 40 weight %. A solution comprising the second polymer may be mixed with a solution comprising the first novel polymer of the present invention described above. A solution comprising the second polymer, crosslinker and thermal acid generator may be mixed with a solution comprising the first novel polymer, crosslinker and thermal acid generator of the present invention. In one embodiment, the antireflective composition of the present invention comprises a thermal acid generator, the first novel polymer comprising structures (1)-(3) described previously and may further comprise the second polymer. The second polymer may be an aromatic polymer comprising fused aromatic rings either pendant from the backbone of the polymer or in the backbone of the polymer. The second polymer may also have different n and k values from the first polymer, which may allow for blending of the first polymer and the second polymer to give desirable values for n and k. The second polymer may have a n (refractive index) value in the range of about 1.4 to about 1.6 at 193 nm; the polymer may have a k (absorbance) value in the range from about 0.2 to about 0.5 at 193 nm.

In one embodiment of the second polymer, the second polymer may be an acrylate polymer with a chromophore of at least 2 fused rings pendant from the backbone of the polymer, for example naphthyl and/or anthracyl group. The monomeric units may be derived from monomers such as 9-anthracenylmethyl methacrylate, 2-hydroxypropylmethacrylate, acetoxyethyl methacrylate, n-butylmethacrylate and their equivalents. An example is poly(9-anthracenylmethyl methacrylate/2-hydroxypropylmethacrylate/acetoxyethyl methacrylate/n-butylmethacrylate).

In another embodiment of the second polymer, the second polymer may comprise at least 3 fused rings in the backbone of the polymer. The fused aromatic unit may have in the range of about 3 to about 8 aromatic rings. The second polymer is described in U.S. application with U.S. Ser. Nos. 11/752,040 and 11/872,962, both of which are incorporated herein by reference. The second polymer of the novel composition comprises at least one unit with three or more fused aromatic rings in the backbone of the polymer and at least one unit with an aliphatic moiety in the backbone of the polymer. Other comonomeric units may also be present, such as substituted or unsubstituted phenyl, or substituted or unsubstituted naphthyl. In one embodiment the second polymer may be free of any phenyl or single ring aromatic moiety. The fused aromatic rings provide the absorption for the coating, and are the absorbing chromophore. The fused aromatic rings of the polymer can comprise substituted or unsubstituted 6 membered aromatic rings which have a common bond to form a fused ring structure, such as units exemplified by structures 8-13 and their isomers,

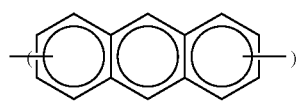

8

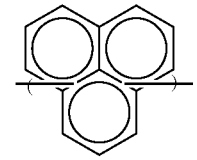

9

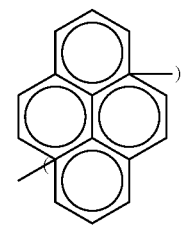

10

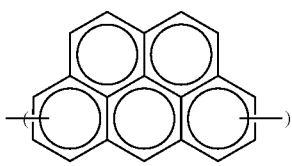

11

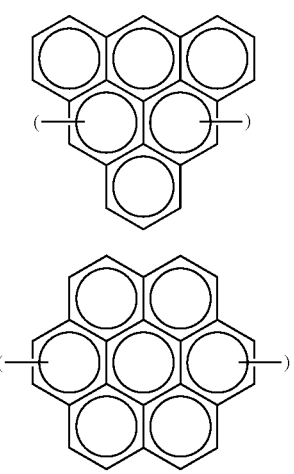

The fused rings may be exemplified by anthracene, phenanthrene, pyrene, fluoranthene, coronene triphenylene and their substituted derivatives.

The fused rings may form the backbone of the second polymer at any site in the aromatic structure and the attachment sites may vary within the polymer. The fused ring structure can have more than 2 points of attachment forming a branched oligomer or branched polymer. In one embodiment of the second polymer the number of fused aromatic rings may vary from 3-8, and in other embodiment of the polymer it comprises 4 or more fused aromatic rings, and more specifically the polymer may comprise pyrene as shown in structure 10. The fused aromatic rings may comprise one or more hetero-aromatic rings, where the heteroatom may be nitrogen or sulfur, as illustrated by structure 14 below.

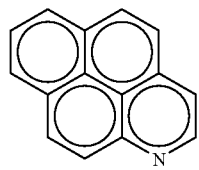

In one embodiment of the second polymer, the polymer comprises the fused aromatic unit described previously and further, in order to isolate the chromophore and prevent further conjugation of the double bond, the fused aromatic unit is connected to an aliphatic carbon moiety. The fused aromatic rings of the second polymer may be unsubstituted or substituted with one or more organo substituents, such as alkyl, alkylaryl, ethers, haloalkyls, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O. In one embodiment of the second polymer, the fused aromatic group is free of any pendant moeity containing nitrogen. The substituents on the aromatic rings may aid in the solubility of the polymer in the coating solvent. Some of the substituents on the fused aromatic structure may also be thermolysed during curing, such that they may not remain in the cured coating and may still give a high carbon content film useful during the etching process. The fused aromatic groups are more generally illustrated by structures 8' to 13', where R$_a$ is an organo substituent, such as hydrogen, hydroxy, hydroxy alkylaryl, alkyl, alkylaryl, carboxylic acid, ester of carboxylic acid, etc., and n is the number of substituents on the rings. The substituents, n, may range from 1-12. Typically n can range from 1-5, where R$_a$, exclusive of hydrogen, is a substituent independently selected from groups such as alkyl, hydroxy, hydroxyalkyl, hydroxyalkylaryl, alkylaryl, ethers, haloalkyls, alkoxy, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O.

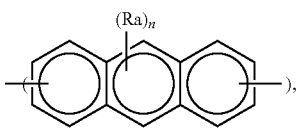

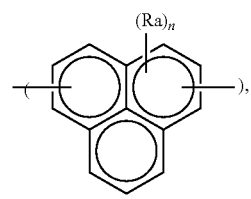

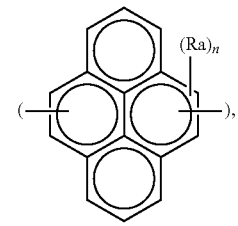

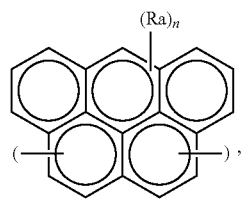

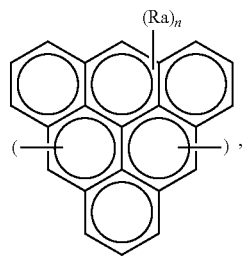

-continued

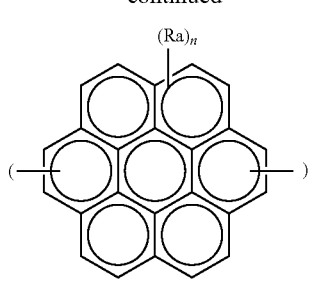

The polymer may comprise more than one type of the fused aromatic structures described herein.

In addition to the fused aromatic unit described above, the second polymer of the novel antireflective coating further comprises at least one unit with an essentially aliphatic moiety in the backbone of the polymer, and the moiety is any that has a nonaromatic structure that forms the backbone of the polymer, such as an alkylene which is primarily a carbon/hydrogen nonaromatic moiety. The polymer can comprise at least one unit which forms only an aliphatic backbone in the polymer, and the polymer may be described by comprising units,-(A)- and -(B)-, where A is any fused aromatic unit described previously, which may be linear or branched, and where B has only an aliphatic backbone. B may further have pendant substituted or unsubstituted aryl or aralkyl groups or be connected to form a branched polymer. The alkylene, aliphatic moiety in the polymer may be selected from a moiety which is linear, branched, cyclic or a mixture thereof. Multiple types of the alkylene units may be in the polymer. The alkylene backbone unit may have some pendant groups present, such as hydroxy, hydroxyalkyl, alkyl, alkene, alkenealkyl, alkylalkyne, alkyne, alkoxy, aryl, alkylaryl, aralkyl ester, ether, carbonate, halo (e.g. Cl, Br). Pendant groups can impart useful properties to the polymer. Some of the pendant groups may be thermally eliminated during curing to give a polymer with high carbon content, for example through crosslinking or elimination to form an unsaturated bond. Alkylene groups such as hydroxyadamantylene, hydroxycyclohexylene, olefinic cycloaliphatic moiety, may be present in the backbone of the polymer. These groups can also provide crosslinking sites for crosslinking the polymer during the curing step. Pendant groups on the alkylene moiety, such as those described previously, can enhance solubility of the polymer in organic solvents, such as coating solvents of the composition or solvents useful for edge bead removal. More specific groups of the aliphatic comonomeric unit are exemplified by adamantylene, dicyclopentylene, and hydroxy adamantylene. The structures of some of the alkylene moieties are given in FIG. 1, where $R_b$ is independently selected from hydrogen, hydroxy, hydroxyalkyl, alkyl, alkylaryl, ethers, halo, haloalkyls, carboxylic acid, ester of carboxylic acid, alkylcarbonates, alkylaldehydes, ketones, and other known substituents, and m is the number of substituents. The number, m, may range from 1-40, depending on the size of the unit. Different or the same alkylene group may be connected together to form a block unit and this block unit may be then connected to the unit comprising the fused aromatic rings. In some cases a block copolymer may be formed, in some case a random copolymer may be formed, and in other cases alternating copolymers may be formed. The copolymer may comprise at least 2 different aliphatic comonomeric units. The copolymer may comprise at least 2 different fused aromatic moieties. In one embodiment the polymer may comprise at least 2 different aliphatic comonomeric units and at least 2 different fused aromatic moieties. In another embodiment of the invention the polymer comprises at least one fused aromatic unit and aliphatic unit(s) free of aromatics. In one embodiment of the unit with the aliphatic group, the cycloalkylene group is selected from a biscycloalkylene group, a triscycloalkylene group, a tetracycloalkylene group in which the linkage to the polymer backbone is through the cyclic structure and these cyclic structures form either a monocyclic, a dicyclic or tricyclic structure. In another embodiment of the second polymer, the polymer comprises a unit with the fused aromatic rings and a unit with an aliphatic moiety in the backbone, where the aliphatic moiety is a mixture of unsubstituted alkylene and a substituted alkylene where the substituent may be hydroxy, carboxylic acid, carboxylic ester, alkylether, alkoxy alkyl, alkylaryl, ethers, haloalkyls, alkylcarbonates, alkylaldehydes, ketones and mixtures thereof.

In another embodiment of the second polymer, it comprises at least one unit with 3 or more fused aromatic rings in the backbone of the polymer, at least one unit with an aliphatic moiety in the backbone of the polymer, and at least one unit comprising a group selected from a substituted phenyl, unsubstituted phenyl, unsubstituted biphenyl, substituted biphenyl, substituted naphthyl and unsubstituted naphthyl. The fused aromatic ring with 3 or more aromatic units and the aliphatic moiety are as described herein. The polymer may be free of any pendant moiety containing nitrogen. The polymer may be free of any pendant moiety containing nitrogen, in one embodiment. The substituents on the phenyl, biphenyl and naphthyl may be at least one polar group that increases the solubility of the polymer in a polar solvent, such as ethyl lactate, propyleneglycol monomethyether acetate (PGMEA) and propyleneglycol monomethyether (PGME). Examples of substituents are hydroxy, hydroxyalkyl, halide, etc. The phenyl, biphenyl or naphthyl group may form part of the backbone or be attached to the polymer backbone directly or through a linking group such as a adamantyl group, ethylene group, etc., and where examples of monomeric units may be derived from monomers such as hydroxystyrene, phenol, naphthol, and hydroxynaphthylene. The incorporation of phenol and/or naphthol moieties in the polymer backbone is preferred for films with high carbon content. The amount of the substituted phenylene, unsubstituted phenylene, unsubstituted biphenylene, substituted biphenylene, substituted naphthylene or unsubstituted naphthylene may range from about 5 mole % to about 50 mole % in the polymer, or from about 20 mole % to about 45 mole % in the polymer. Compositions comprising polymers of the present invention which further comprise phenolic and/or naphthol groups are useful when the coating solvent of the composition is PGMEA or a mixture of PGMEA and PGME. Compositions comprising polymers of the present invention which further comprise phenolic and/or naphthol groups are also useful when the excess composition is to be removed with an edgebead remover, especially where the edgebead remover comprises PGMEA or a mixture of PGMEA and PGME. Other edgebead removers comprising ethyl lactate may also be used. In one embodiment the composition comprises a polymer comprising at least one unit with 3 or more fused aromatic rings in the backbone of the polymer, at least one unit with an aliphatic moiety in the backbone of the polymer, and at least one unit comprising a group selected from phenol, naphthol and mixtures thereof. Pyrene, as the fused aromatic moiety, may be used. The composition may further contain a solvent comprising PGMEA. Other additives, as described herein, may be used in the composition.

The second polymer of the present novel composition may be synthesized by reacting a) at least one aromatic compound comprising 3 or more fused aromatic rings capable of electrophilic substitution such that the fused rings form the backbone of the polymer, with b) at least one essentially aliphatic compound. The aromatic compound may be selected from monomers that provide the desired aromatic unit, more specifically structures 8-14 or 8'-13' or equivalents, and may be further selected from compounds such as anthracene, phenanthrene, pyrene, fluoranthene, and coronene triphenylene. The fused aromatic rings provide at least 2 reactive hydrogens which are sites for electrophilic substitution. The aliphatic compound is an essentially linear, branched or cyclic substituted or unsubstituted alkyl compound capable of forming the aliphatic unit in the polymer, and also capable of forming a carbocation in the presence of an acid, and may be selected from compounds such as aliphatic diol, aliphatic triol, aliphatic tetrol, aliphatic alkene, aliphatic diene, etc. Any compound that is capable of forming the alkylene unit in the polymer of the novel composition as described previously may be used. The aliphatic monomer may be exemplified by 1,3-adamantanediol, 1,5-adamantanediol, 1,3,5-adamantanetriol, 1,3,5-cyclohexanetriol, and dicyclopentadiene. Other monomers may also be added into the reaction mixture, such as phenol and/or naphthol. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong normucleophilic acids. The reaction may be carried out with or without a solvent. If a solvent is used then any solvent capable of dissolving the solid components may be used, especially one which is non-reactive towards strong acids; solvents such as chloroform, bis(2-methoxyethyl ether), nitrobenzene, methylene chloride, and diglyme may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, cyclohexanone, etc., through precipitation and washing. Known techniques of reacting, isolating and purifying the polymer may be used. The weight average molecular weight of the second polymer can range from about 1,000 to about 50,000, or about 1300 to about 20,000. The carbon content of the second polymer is greater than 80% as measured by elemental analysis, preferably greater than 85%.

The antireflection coating composition of the present invention may contain 1 weight % to about 15 weight % of polymer or mixture of polymers, and preferably 4 weight % to about 10 weight %, of total solids. The crosslinker, when used in the composition, may be present at about 1 weight % to about 30 weight % of total solids. The thermal acid generator or photo acid generator, may be incorporated in a range from about 0.1 to about 10 weight % by total solids of the antireflective coating composition, preferably from 0.3 to 5 weight % by solids, and more preferably 0.5 to 2.5 weight % by solids.

The solid components of the antireflection coating composition are mixed with a coating solvent or mixtures of coating solvents that dissolve the solid components of the antireflective coating. Suitable solvents for the antireflective coating composition may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. In one embodiment of the solvent, the solvent composition comprises PGME. In another embodiment of the solvent, the solvent composition comprises PGME and PGMEA.

The antireflective coating composition comprises the polymer, and other components may be added to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.3 to about 0.7 at the exposure wavelength. The refractive index (n) of the antireflective coating is also optimized and can range from about 1.3 to about 2.0, preferably 1.5 to about 1.8 at the exposure wavelength. The n and k values can be calculated using an ellipsometer, such as the J. A. Woollam WVASE VU-32™ Ellipsometer. The exact values of the optimum ranges for k and n are dependent on the exposure wavelength used to expose the photoresist coated above the novel coating, and the type of application. Typically for 193 nm the preferred range for k is about 0.3 to about 0.7, and preferred range for n is about 1.5 to about 1.78, and for 248 nm the preferred range for k is about 0.15 to about 0.8, and preferred range for n is about 1.5 to about 1.78.

The carbon content of the novel antireflective coating composition is greater than 75 weight % or greater than 85 weight % as measured by elemental analysis. The carbon content can range from about 75 weight % to about 85 weight % or 78 weight % to about 83 weight %.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an absorption (k) value in the range of about 0.05 and 0.5 and refractive index (n) similar to the bottom antireflective coating. A film of photoresist is then coated over the second coating.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/N compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process. Typically, chemically amplified photoresists are used.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/ onium salts, such as those described in U.S. Pat. No. 4,491, 628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866, 984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography. Photoresists useful for 193 nm imaging may be used.

After the coating process, the photoresist is imagewise exposed. The exposure may be done using typical exposure equipment, such as 248 nm or 193 nm stepper exposure equipment. An optional heating step may be used after exposure. The exposed photoresist is then developed in an aqueous developer to remove the treated photoresist. The developer is preferably an aqueous alkaline solution comprising, for example, tetramethyl ammonium hydroxide (TMAH). The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Examples 1-8

Synthesis of Poly(9-AMMA-co-Styrene-co-HEMA)

The three monomers, 9-anthracenemethylenemethacrylate (9-AMMA), styrene, and hydroxyethylenemethacrylate (HEMA) with molar ratios as given in Table 1, were weighed into a 500 mL reaction flask with 3% AIBN (based on monomer weight) and dissolved in 250 g PGMEA. This mixture was heated to 100° C. and held for 8 hours. The reaction was allowed to cool to room temperature and the polymer precipitated by drowning into 2.5 L hexane. The polymer was collected and dried under vacuum. To remove the residual monomers, the polymer was slurried in 500 mL of acetone, then drowned into 2.5 L hexane. Again, the polymer was collected and dried under vacuum. The dry polymer was dissolved in 250 mL terahydrofuran and while mixing on a stir plate, 100 mL acetone was added. The solution was then drowned into 2.5 L hexane. The polymer was filtered, washed, and dried under vacuum. This produced a polymer with no measurable amounts of residual monomers. The process was repeated and the results are given in Table 1.

n & k Measurement: 0.125 g of polymer (from Example 1 to 8) and 9.875 g of ArF Thinner were weighed into a 20 mL vial. The mixture was allowed to mix until all the materials become soluble. The homogeneous solution was filtered with 0.2 μm membrane filter. This filtered solution was spin-coated on a 4" silicon wafer at 2000 rpm. The coated wafer was baked on a hotplate at 230° C. for 60 seconds. Then, n and k values were measured with a VASE Ellipsometer manufactured by J. A. Woollam Co. Inc. The optical constants n and k of the film for 193 nm radiation are shown in Table-1, n/k column. The solubility was checked in ArF Thinner.

Example 17

Blanket etch rates of the coatings of the antireflective coatings were measured on a NE-5000 N (ULVAC) using both an oxidative and a fluorocarbon-rich etch condition outlined in Table 2. The antireflective coating film (Example 9) and the 193 nm photoresist AZ® AX1120P (available from AZ® Electronic Materials, Somerville, N.J., USA) with about 250 nm thickness were coated on 8 in silicon wafers, baked at 240° C. for 1 minute. Individual film thickness measuring programs on a Nanospec 8000 using Cauchy's material-dependent constants derived by VASE analysis of the films and a 5 point inspection were performed before and after a 20 second etch. Etch rates were then calculated by taking the film thickness difference divided by etch times.

Etch rate masking potential is revealed in the etch rate data in Table 3 and 4 below. The polymer from Example 1 in the formulation Example 9 was shown to have a greater etch resistance (or slower etch rate) than the 193 nm photoresist.

TABLE 1

| Examples | 9-AMMA | Styrene | 2-HEMA | Mw/Pd | Polymer Yield (%) | n/k | Solubility in ArF Thiner |
|---|---|---|---|---|---|---|---|
| 1 | 0.1 mole | 0.1 mole | 0.065 mole | 16,143/2.40 | 64 | 1.63/0.47 | good |
| 2 | 0.1 mole | 0.1 mole | 0.065 mole | 15366/2.6 | 64 | 1.63/0.47 | good |
| 3 | 0.1 mole | 0.1 mole | 0.065 mole | 15639/2.6 | 64 | 1.63/0.47 | good |
| 4 | 0.1 mole | 0.1 mole | 0.065 mole | 16466/2.4 | 64 | 1.63/0.47 | good |
| 5 | 0.1 mole | 0.1 mole | 0.065 mole | 15382/2.5 | 65 | 1.64/0.47 | good |
| 6 | 0.1 mole | 0.1 mole | 0.065 mole | 14695/2.61 | 67 | 1.64/0.47 | good |
| 7 | 0.1 mole | 0.1 mole | 0.065 mole | 14724/2.7 | 68 | 1.64/0.47 | good |
| 8 | 0.1 mole | 0.1 mole | 0.065 mole | 15301/2.60 | 67 | 1.64/0.47 | good |

Mw weight average molecular weight
Pd polydispersity
n/k refractive index/absorption

Examples 9 to 16

Soak Test for cross linking check: 0.9 g polymer from example 1, 0.09 g tetramethoxymethyl bis phenol (TMOM-BP), 0.36 g of thermal acid generator dodecylbenzenesulphonic acid triethylamine salt (DBSA:E) as a 6% solution and 13.65 g ArF thinner were weighed into a 30 mL vial. The mixture was allowed to mix until all the materials become soluble. The homogeneous solution was filtered with 0.2 μm membrane filter to give formulation example 9. This filtered solution was spin-coated on a 4" silicon wafer at 1500 rpm. The coated wafer was baked on hotplate at 230° C. for 60 seconds. After bake, the wafer was cooled to room temp and partially submerged in PGME for 30 seconds. The two halves of the wafer were examined for changes in film thickness. Due to effective crosslinking, no film loss was observed after soaking in the solvent.

Further compositions were formulated replacing the polymer from Example 1 in Example 9 with polymer from examples 2-8 to give respectively formulation Examples 10-16. The soak test was repeated for polymer from formulation Examples 10-16 and the results showed no film loss in the soak test due to effective crosslinking.

TABLE 2

Etch conditions used in the blanket etch rate studies

| | Etch condition | |
|---|---|---|
| | Oxidative condition | Fluorocarbon condition |
| Gas | $Cl_2/O_2/Ar$, 24/6/25 SCCM | $CF_4/O_2/Ar$, 50/20/150 SCCM |
| Process Pressure | 1.6 Pa | 5 Pa |

Plate temperature: 20° C.;
RF power: 500 W with 50 W bias.

TABLE 3

Etch rate using Oxidative condition.

| Formulation | Etch rate (nm/s) | Relative etch rate |
|---|---|---|
| Example 9 | 4.47 | 0.70 |
| AZ ® AX1120P | 6.30 | 1.00 |

TABLE 4

| Formulation | Etch rate using Fluorocarbon condition | |
|---|---|---|
| | Etch rate (nm/s) | Relative etch rate |
| Example 9 | 3.1 | 0.79 |
| AZ® AX1120P | 3.9 | 1.00 |

Example 18

Lithography

An 8 in silicon wafer was coated with the composition of formulation Example 16 and baked at 230° C. for 60 seconds to give a coating of 285 nm. AZ® ArF S24H, a silicon containing bottom antireflective coating available from AZ® Electronic Materials Corp., was coated over the coating from Example 16, and baked at 230° C. for 60 seconds to give a thickness of 94 nm. AZ® AX 2110P (a 193 nm photoresist available from AZ® Electronic Materials Corp.) was then coated on top and soft baked at 100° C. for 60 seconds. The photoresist was exposed imagewise using a 193 nm exposure tool Nikon NSR-306D: NA=0.85, Annular Illumination 0.82/0.66 with a 6% half tone phase shift mask, post exposure baked at 110° C. for 60 seconds and then developed in 0.26N aqueous TMAH solution developer. The line and space patterns were then observed on a scanning electron microscope and the patterns with the 80 nm line/space at a photospeed of 37 mJ/cm$^2$ were resolved.

Example 19

Synthesis of Poly(pyrene-co-phenol-co-adamantanyl)

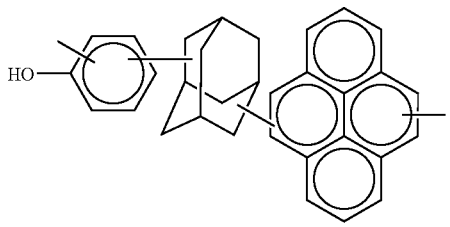

Pyrene (20.25 g~0.1 mole), 1,3-adamantane diol (16.8 g~0.1 mole), and phenol (9.41 g~0.1 mole) were taken in a 500 mL 4Neck round bottom flask, equipped with stirrer, condenser, Dean Stark trap, Thermo watch and N$_2$ sweep. 140 g of diglyme and 40 g of cyclopentyl methyl ether were added, mixed for 10 minutes under nitrogen and 1.50 g of trifluoromethane sulphonic acid was added. The flask was heated to reflux at 140° C., for three hours. After the reaction, the flask was cooled to room temperature. The reaction mixture was drowned into 1.4 liters of methanol, a precipitate formed which was filtered through a Buckner Funnel and dried under vacuum. The crude polymer was redissolved in cyclopentyl methyl ether and washed with water three times and then mixed with 1.5 liters of hexane and a precipitate was formed. The mixture was filtered, washed with hexane and dried under vacuum, 9.8 g of polymer was formed with a 45% yield.

Example 20

1.5 g of polymer from Example 19, 0.15 g of TMOM-BP, 0.4 g of DBSA/E TAG as 10% solution and 12.75 g of ArF thinner were weight into 30 mL vial. The mixture was allowed to mix until all the materials become soluble.

In a separate vial 1.5 g of polymer from Example 1, 0.15 g of TMOM-BP, 0.4 g of DBSA/E TAG as 10% solution and 12.75 g of ArF thinner were weight into 30 mL vial. The mixture was allowed to mix until all the materials become soluble.

The solution from above two vials were mixed and stirred overnight. The homogenous coating mixture was filtered through 0.2 μm membrane filter.

n & k Measurement: A portion of the homogeneous coating mixture was diluted to 1% solid and the homogeneous solution was filtered with 0.2 μm membrane filter. This filtered solution was spin-coated on a 4" silicon wafer at 1500 rpm. The coated wafer was baked on hotplate at 230° C. for 60 seconds. Then, n and k values were measured with a VASE Ellipsometer manufactured by J. A. Woollam Co. Inc. The optical constants n and k of the containing film for 193 nm radiation were found to be n=1.55; k=0.52.

Soak Test The filtered homogeneous coating mixture was spin-coated on a 4" silicon wafer at 1500 rpm. The coated wafer was baked on a hotplate at 230° C. for 60 seconds. After bake, the wafer was cooled to room temperature and partially submerged in PGME for 30 seconds. The two halves of the wafer were examined for changes in film thickness. The results showed no film loss after soaking due to effective crosslinking.

The invention claimed is:
1. An antireflective coating composition comprising a polymer, a crosslinker and a thermal acid generator, where the polymer comprises at least one unit of structure (1), at least one unit of structure (2) and at least one unit of structure (3),

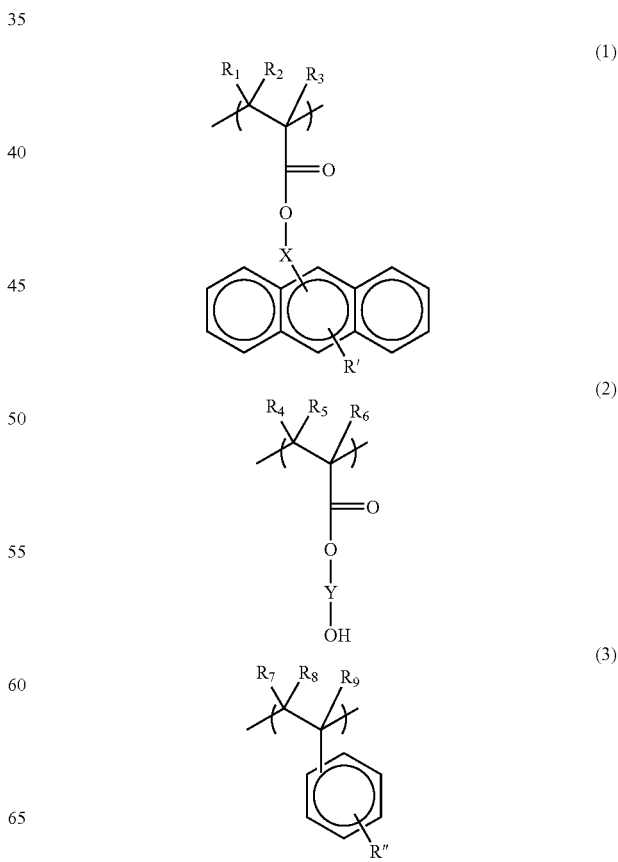

where $R_1$ to $R_9$ is independently selected from H and $C_1$-$C_6$ alkyl, R' and R" is independently selected from H and $C_1$-$C_6$ alkyl, X is $C_1$-$C_6$ alkylene, Y is $C_1$-$C_6$ alkylene, further where the carbon content of the composition is in the range of about 75 weight % to about 85 weight %.

2. The antireflective coating composition of claim 1, where the unit of structure (1) is in the range of about 20 mole % to about 35 mole %.

3. The antireflective coating composition of claim 1, where the refractive index value is in the range of about 1.5 to about 1.8 at 193 nm.

4. The antireflective coating composition of claim 1, where X is methylene.

5. The antireflective coating composition of claim 1, where Y is ethylene.

6. The antireflective coating composition of claim 1, where R" is hydrogen.

7. The antireflective coating composition of claim 1, where the polymer has the structure comprising units 4, 5 and 6,

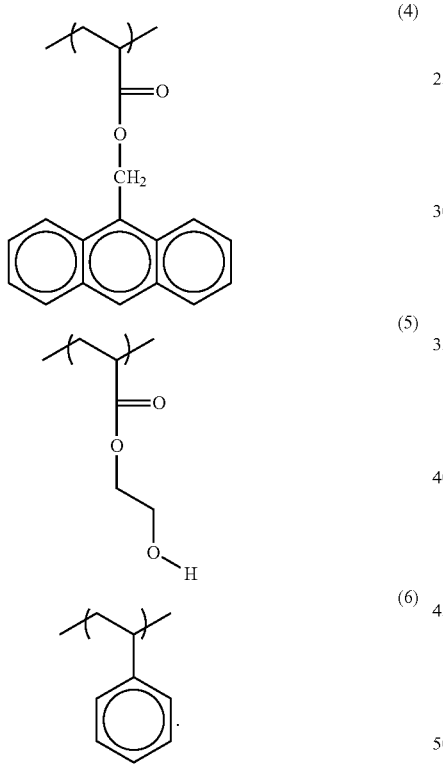

8. The antireflective coating composition of claim 1, where the crosslinker is selected from melamines, methylols, glycolurils, polymeric glycolurils, hydroxy alkyl amides, epoxy and epoxy amine resins, blocked isocyanates, polymeric crosslinkers, and divinyl monomers.

9. The composition of claim 1, where the thermal acid generator is selected from alkyl ammonium salts of organic acids, phenolic sulfonate esters, nitrobenzyl tosylates, and metal-free iodonium and sulfonium salts.

10. The composition of claim 1, where the polymer is soluble in a solvent comprising PGME.

11. The composition of claim 1, further comprising a second polymer.

12. The composition of claim 1, further comprising a second polymer comprising 4 or more fused aromatic rings.

13. A process for forming an image comprising,
   a) coating and baking a substrate with the antireflective coating composition of claim 1;
   b) coating and baking a photoresist film on top of the antireflective coating;
   c) imagewise exposing the photoresist to radiation;
   d) developing an image in the photoresist;
   e) optionally, baking the substrate after the exposing step.

14. The process of claim 13, where the photoresist is imagewise exposed at wavelengths between 130 nm to 250 nm.

15. The process of claim 13, where the photoresist comprises a polymer and a photoactive compound.

16. The process of claim 13, where the antireflective coating is baked at temperatures greater than 90° C.

17. The process of claim 13, where additional layer(s) of antireflective coating are formed over the antireflective coating.

18. An antireflective coating composition comprising a polymer, a crosslinker and a thermal acid generator, where the polymer comprises at least one unit of structure (1), at least one unit of structure (2) and at least one unit of structure (3),

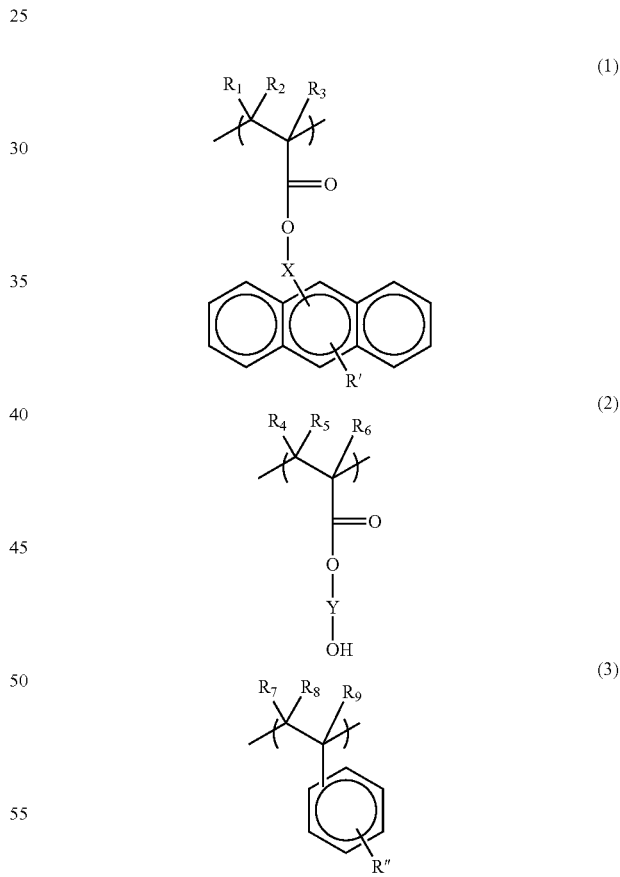

where $R_1$ to $R_9$ is independently selected from H and $C_1$-$C_6$ alkyl, R' and R" is independently selected from H and $C_1$-$C_6$ alkyl, X is $C_1$-$C_6$ alkylen, Y is $C_1$-$C_6$ alkylene, further where the absorption parameter is in the range of about 0.3 to about 0.7 at 193 nm.

* * * * *